(12) United States Patent
Camerlo et al.

(10) Patent No.: US 7,154,761 B1
(45) Date of Patent: Dec. 26, 2006

(54) TECHNIQUES FOR DISTRIBUTING CURRENT IN A BACKPLANE ASSEMBLY AND METHODS FOR MAKING THE SAME

(75) Inventors: Sergio Camerlo, Cupertino, CA (US); Irfan Elahi, Pleasanton, CA (US)

(73) Assignee: Cisco Technology, Inc., San Jose, CA (US)

( * ) Notice: Subject to any disclaimer, the term of this patent is extended or adjusted under 35 U.S.C. 154(b) by 226 days.

(21) Appl. No.: 10/778,418

(22) Filed: Feb. 13, 2004

(51) Int. Cl.
*H01R 12/16* (2006.01)
(52) U.S. Cl. .................... 361/788; 361/796; 361/800
(58) Field of Classification Search ................ 361/788, 361/796–800; 710/303–305
See application file for complete search history.

(56) References Cited

U.S. PATENT DOCUMENTS

| | | | | |
|---|---|---|---|---|
| 6,144,561 A | * | 11/2000 | Cannella et al. ............ 361/796 |
| 6,552,277 B1 | | 4/2003 | Downes ...................... 174/267 |
| 6,762,362 B1 | | 7/2004 | Cavanaugh et al. ........ 174/68.2 |
| 6,773,269 B1 | * | 8/2004 | Downes ........................ 439/75 |
| 6,795,885 B1 | * | 9/2004 | deBlanc et al. ............. 710/305 |

* cited by examiner

*Primary Examiner*—Tuan Dinh
(74) *Attorney, Agent, or Firm*—BainwoodHuang (57) ABSTRACT

A backplane assembly includes a main backplane having a first power conductor, a backplane strip having a second power conductor, and connecting members disposed between the main backplane and the backplane strip. The connecting members hold the backplane strip in a fixed position relative to the main backplane and electrically connect the first power conductor and the second power conductor. In one arrangement, the connecting members include source standoffs which extend from a source area of the main backplane to the backplane strip, and target standoffs which extend from a target area of the main backplane to the backplane strip. The source and target standoffs and the second power conductor provide a current path which increases current carrying capacity from the source area to the target area above that provided by the first power conductor alone. Thus, the backplane assembly is well-provisioned for distributing high currents to circuit boards.

15 Claims, 5 Drawing Sheets

TECHNIQUES FOR DISTRIBUTING CURRENT IN A BACKPLANE ASSEMBLY AND METHODS FOR MAKING THE SAME

BACKGROUND

A typical electronic system includes, among other things, (i) a frame, (ii) a power supply supported by the frame, and (iii) operating circuitry which is powered by the power supply and which is also supported by the frame. In some systems, the operating circuitry includes multiple circuit boards and an interconnection mechanism. The multiple circuit boards include integrated circuit devices (e.g., processors, application specific integrated circuits, discreet components, etc.) which derive power signals from the interconnection mechanism as well as exchange data signals through the interconnection mechanism.

One conventional interconnection mechanism includes a card cage and a backplane which mounts to a back end of the card cage. The backplane is essentially a large circuit board, i.e., a plane-shaped structure formed from layers of conductive material (e.g., copper) and non-conductive material (e.g., FR4) sandwiched together. The backplane typically has pads or power supply connectors on the side facing away from the card cage, and columns of backplane connectors on the side facing the card cage. To assemble the system, an installer connects the pads or power supply connectors of the backplane to the power supply using a set of cables, or directly plugs connectors of the power supply into connectors of the backplane. The installer also connects the circuit boards to the backplane by sliding the circuit boards into respective slots of the card cage until rows of circuit board connectors along the leading edges of the circuit boards connect with respective columns of backplane connectors on the backplane. At this point, the circuit boards are capable of obtaining power from the backplane as well as exchanging data signals with each other and perhaps other devices through the backplane.

As the complexity and operating speeds of circuit board components increase over time, so do the power demands of such components. As a result, there is a growing need for backplanes to provide power signals at higher currents to circuit boards (e.g., at many hundreds of Amps). Not only must backplanes be capable of obtaining these higher currents from the power supplies, backplanes must also be capable of distributing these higher currents reliably and robustly to the circuit boards at their respective connecting locations (i.e., to the respective columns of backplane connectors) without substantial signal degradation (e.g., with voltage drops along the backplane remaining within acceptable limits). To this end, there are a variety of conventional approaches that a manufacturer may use to increase the current distribution characteristics of a backplane design.

One conventional approach to increasing current distribution in a backplane design is for the manufacturer to increase the thicknesses of the power planes in the backplane design and/or the number of power planes in the backplane design. If the manufacturer increases the thickness of a power plane (e.g., from 1 oz. copper to 2 oz. copper), the power plane is now capable of carrying higher current. Similarly, if the manufacturer adds a power plane, the overall amount of current through the backplane increases. Thus, with thicker power planes and/or more power planes, the manufacturer successfully increases the current distribution characteristics of the backplane.

Another conventional approach to increasing current distribution in a backplane design is for the manufacturer to configure the outer side of the backplane with auxiliary power supply pads or connectors, and then attach metal busbars or cables to those pads or connectors to provide additional current paths along the backplane. The additional current carrying capacity provided by these metal busbars or cables prevents the voltage drop along the backplanes from falling outside of budgeted limits.

SUMMARY

Unfortunately, there are deficiencies to the above-described conventional approaches to increasing the current distribution characteristics of a backplane design. For example, the first conventional approach, which involves a manufacturer increasing the thicknesses of the power planes in the backplane design and/or the number of power planes in the backplane design, is significantly expensive. In particular, the manufacturer must incur the additional costs of fabricating a thicker backplane (e.g., the costs associated with making additional backplane sheets, aligning the sheets, gluing the sheets together to form the multiple layers of the backplane, etc.). Furthermore, the manufacturer must incur the additional cost of provisioning the frame of the system to accommodate what may be significant increases in the weight and thickness of the larger backplane.

Similarly, the second conventional approach described above, which involves a manufacturer configuring the backplane with auxiliary pads or connectors and attaching additional busbars or cables, suffers from several drawbacks. In particular, there may be situations in which it would be convenient to externally convey high speed signals (e.g., data signals) from one backplane location to another. Unfortunately, metal busbars and cables do not provide a means for reliably conveying such high speed signals since they do not share the same electrical characteristics of backplanes (e.g., impedance, wave propagation delays, capacitance, etc.). Furthermore, if bare metal busbars are used, there is the additional risk of encountering a dangerous electrical event such as electrical arching across busbars or shorts due to objects inadvertently contacting the busbars.

In contrast to the above-described conventional approaches, embodiments of the invention are directed to current distribution techniques which utilize a backplane and a backplane strip (or patch) that is configured to carry current in parallel with a power conductor of the backplane. The backplane strip includes circuit board material which is capable of being made from an excess portion during the backplane fabrication process. Accordingly, the backplane strip is capable of being configured to have the same characteristics as the backplane itself for (i) robust signal integrity and (ii) safety which is superior to simply attaching bare metal busbars. Additionally, costs associated with utilizing a backplane strip can be significantly lower than those associated with either adding backplane layers or thickening backplane layers.

One embodiment of the invention is directed to a backplane assembly which includes a main backplane having a first power conductor, a backplane strip having a second power conductor, and a set of connecting members disposed between the main backplane and the backplane strip. The set of connecting members (i) holds the backplane strip in a fixed position relative to the main backplane and (ii) electrically connects the first power conductor and the second power conductor. In one arrangement, the set of connecting members includes source standoffs which extend from a source area of the main backplane to the backplane strip, and target standoffs which extend from a target area of the main backplane to the backplane strip. The source and target standoffs and the second power conductor provide a current path which increases current carrying capacity from the source area to the target area above that provided by the first power conductor alone. Thus, the backplane assembly is better-provisioned for distributing high currents to circuit boards.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for distributing current using a backplane and a backplane strip (or patch) which is configured to carry current in parallel with a power conductor of the backplane. The backplane strip includes circuit board material which is capable of being made from an excess portion during the backplane fabrication process. Accordingly, the backplane strip is capable of being configured to have the same circuit board characteristics as the backplane itself (e.g., for safety purposes there is no need for exposed busbars). Additionally, costs associated with utilizing a backplane strip can be significantly lower than those associated with either adding backplane layers or thickening backplane layers, as in conventional approaches to increasing current distribution in a backplane design.

Figure 1:
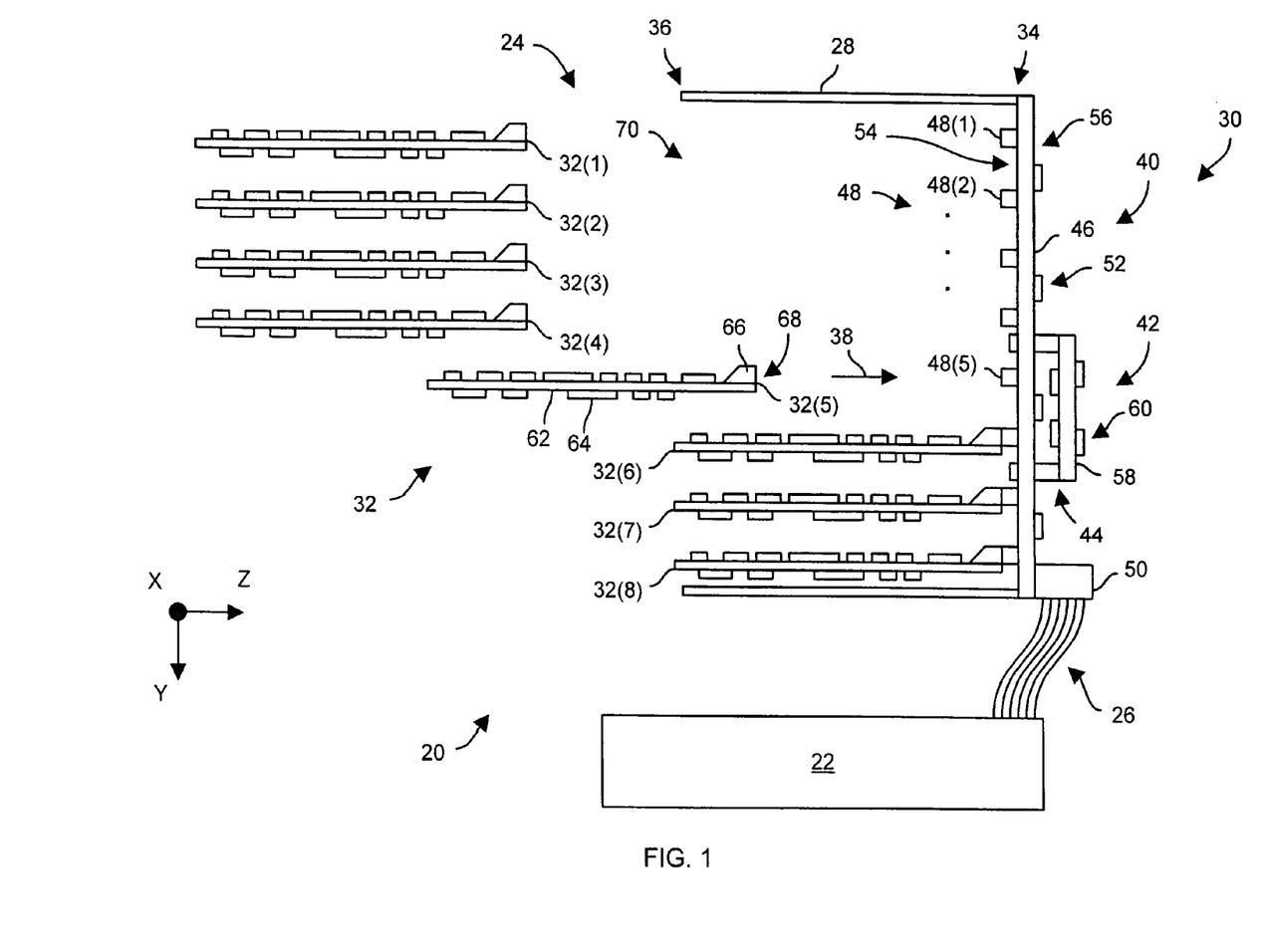
FIG. 1 is a diagram of an electronic system which is suitable for use by the invention.

FIG. 1 shows an electronic system 20 which is suitable for use by the invention. The electronic system 20 includes a power supply 22, operating circuitry 24 and power supply connections 26 (e.g., busbars, cables, etc.). The power supply connections 26 are configured to convey a variety of power supply signals (e.g., 3.3 VDC, 5.0 VDC, 12 VDC, etc.) to the operating circuitry 24.

The operating circuitry 24 includes a chassis 28 (e.g., a card cage, a housing, etc.), a backplane assembly 30 and a set of circuit board modules 32(1), . . . , 32(8) (hereinafter simply modules 32). The chassis 28 is capable of residing as a standalone frame, or attaching to another frame (e.g., an electronic cabinet, an electronic rack, etc.). The backplane assembly 30 has improved current distribution characteristics and resides at a back end 34 of the chassis 28. The modules 32 insert through a front end 36 of the chassis 28 in a direction 38 along the Z-axis and are configured to connect with the backplane assembly 30. As mentioned earlier, the drawings are not necessarily to scale with the emphasis instead being placed upon illustrating the principles of the invention.

The operating circuitry 24 is configured to perform electronic operations while obtaining power from the power supply 22 through the backplane assembly 30. In particular, each module 32 of the operating circuitry 24 is configured to carryout a variety of computerized functions in conjunction with the other modules 32. By way of example only, the electronic system 20 is a data communications device which is configured to steer data elements (e.g., packets, cells, frames, etc.) from input ports selectively to particular output ports within a network. Accordingly, in this example, each module 32 performs data communications operations (e.g., switching operations, classification and routing operations, etc.) to direct the data elements along network pathways between end nodes of the network.

As shown in FIG. 1, the backplane assembly 30 includes a main backplane 40, a backplane strip (or patch) 42, a set of connecting members 44. The main backplane 40 includes a motherboard 46, rows of backplane connectors 48(1), 48(2), . . . (collectively, backplane connectors 48), a set of power supply connectors 50 (shown generally in FIG. 1 as a block 50), and electronic components 52 (e.g., resistors, diodes, capacitors, etc.). The rows of backplane connectors 48 are disposed on a front side 54 of the motherboard 46 which faces the chassis 28 (i.e., a direction opposite the direction 38 in FIG. 1). The set connecting members 44, the set of power supply connectors 50 and the electronic components 52 are disposed on a back side 56 of the motherboard 46 which faces away from the chassis 28. The set of power supply connectors 50 connect with the power supply connections 26 thus electrically coupling the backplane assembly 30 with the power supply 22.

The backplane strip 42 includes a circuit board 58 and electronic components 60 mounted to the circuit board 58. The connecting members 44 support the circuit board 58 of the backplane strip 42 in a substantially fixed parallel position relative to the main backplane 40. By way of example only, the connecting members 44 are long enough to provide adequate clearance for electronic components 60 to reside on the side of the circuit board 58 facing the motherboard 46. Similarly, there is adequate clearance for some of the electronic components 52 to reside on the back side 56 of the motherboard 46 underneath the backplane strip 42.

As further shown in FIG. 1, each module 32 includes a circuit board 62, circuit board components 64, and a row of circuit board connectors 66 disposed along a leading edge 68 of the module 32. Accordingly, when a user inserts a module 32 through a front opening 70 of the chassis 28 at the front end 36 of the chassis 28 (e.g., along a card cage slot of a card cage) in the direction 38, the circuit board connectors 66 of the module 32 engage a row of backplane connectors 48 of the backplane assembly 30 thus connecting the module 32 to the main backplane 40. For example, see the module 32(5) moving in the direction 38 and about to engage a corresponding row of backplane connectors 48(5) in FIG. 1.

It should be understood that the backplane assembly 30 robustly powers the modules 32 due to the presence of the backplane strip 42. In particular, current flows through both the motherboard 46 and through the backplane strip 42 thus preventing the voltage from dropping significantly at remote backplane locations, i.e., backplane locations which are relatively far away from the power supply connectors 50. Accordingly, the backplane assembly 30, as a whole, is well-suited for accommodating high current demand from complex and high speed circuits on the modules 32 which tend to demand large amounts of power. Further details of the invention will now be provided with reference to FIG. 2.

Figure 2:
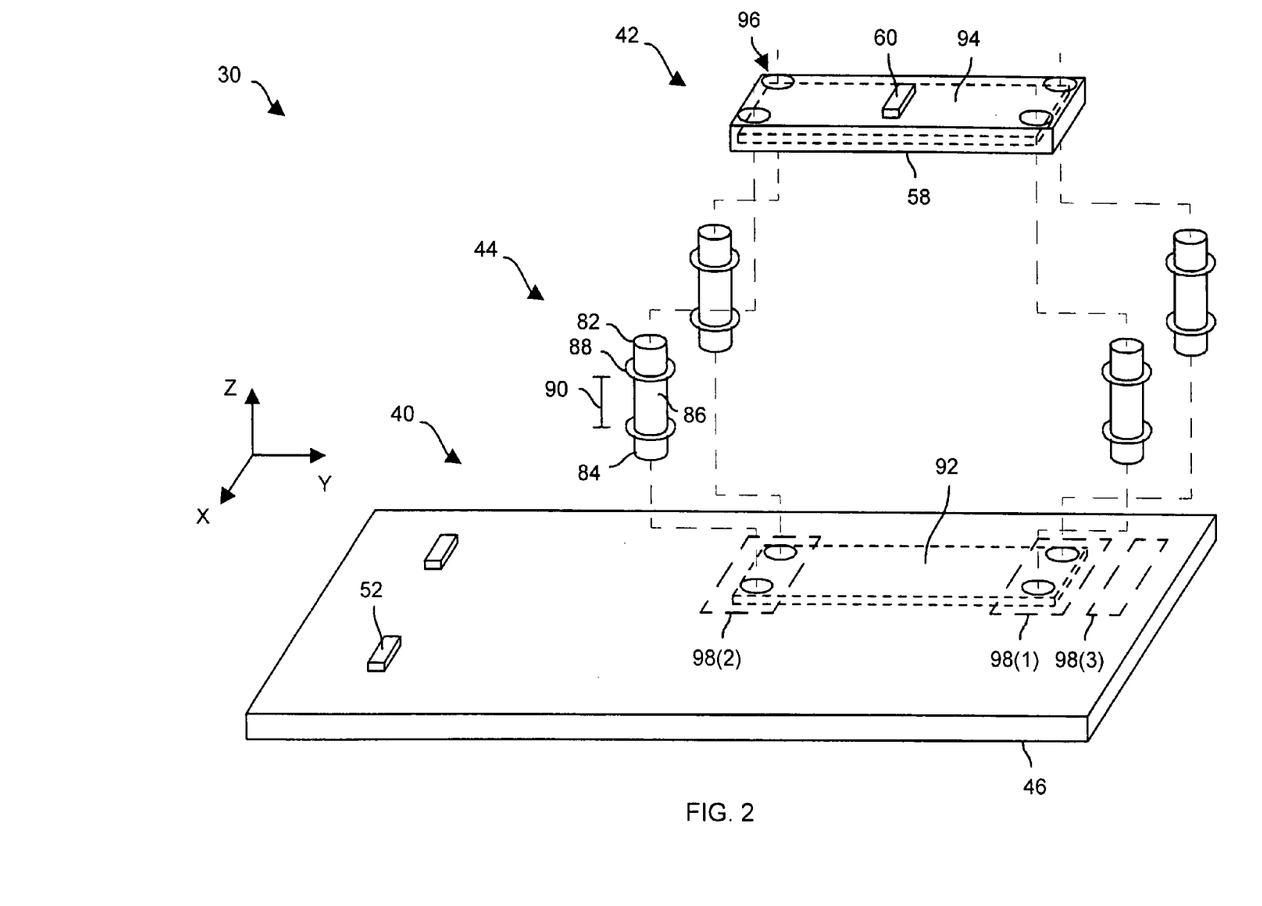
FIG. 2 is an exploded view of a backplane assembly having a main backplane and a backplane strip which is used by the electronic system of FIG. 1.

FIG. 2 is an exploded view of the backplane assembly 30. By way of example only, there are four connecting members 44 shown which extend from the main backplane 40 toward the backplane strip 42 in the Z-axis direction. It should be understood that there may be more connecting members 44 depending factors such as the number signals and the desired amount of current carried by the backplane strip 42, and the desired backplane locations for distributing that current. The connecting members 44 include first end portions 82 which fasten to the backplane strip 42, second end portions 84 which fasten to the main backplane 40, and mid portions 86 which are defined by flanges 88 to provide a separation distance 90 between the first end portions 82 and the second end portions 84 to evenly position the backplane strip 42 in a substantially parallel position relative to the main backplane 40, i.e., substantially in X-Y planes (also see FIG. 1). In one arrangement, the separation distance 90 between the flanges 88, which prevent the connecting members 44 from inserting further into the circuit boards, is large enough to enable electronic components 52, 60 to reside between the motherboard 46 of the main backplane 40 and the circuit board 58 of the backplane strip 34 (see FIG. 1).

It should be understood that a variety of hardware components are suitable for use as the connecting members 44. It should be further understood that the connecting members 44 perform the dual operation of (i) holding the backplane strip 42 in a fixed position relative to the main backplane 40 and (ii) electrically connecting a conductor 92 of the main backplane 40 with a conductor 94 of the backplane strip 42. The addition of the conductor 94 increases the amount of conductive material (e.g., copper) for conveying a power signal without substantially interfering with other critical characteristics of the main backplane 40 such as manufacturing costs, board weight and board thickness.

By way of example only, the conductors 92, 94 are illustrated as dashed lines to represent inner layer conductive planes. In one arrangement, the backplane strip 42 includes cut-through vias 96 which electrically connect with the conductor 94. Here, the connecting members 44 are metallic standoffs that robustly solder to the cut-through vias 96 at the ends 82 (e.g., using a standard soldering process). In this arrangement, the opposite ends 84 solder to (or alternatively screw onto) the motherboard 46. For example, after the connecting members 44 solder to the circuit board 58, the assembly is subsequently soldered to the motherboard 46 during the same assembly process used for mounting the motherboard components 52 (e.g., automated pick-and-place and solder reflow equipment is used to mount the assembly to the motherboard 46). In another arrangement, the connecting members 44 include other hardware (e.g., compression fit pins, threaded bolts, screws, nuts, etc.).

During operation of the system 20, the backplane strip 42 and connecting members 44 provide a current path from a source location 98(1) to a target location 98(2) of the main backplane 40. Accordingly, when the power supply 22 provides a power signal to the backplane assembly 30 at a location 98(3) (also see the block 50 in FIG. 1), the current carrying capacity of the backplane assembly 30 for that power signal between the locations 98(1), 98(2) is increased above that which is provided solely by the main backplane conductor 92. In particular, there is less drop in potential difference between the location 98(1), 98(2) thus enabling the backplane assembly 30 to provide adequate power to each module 32 through the rows of backplane connectors 48 (FIG. 1).

It should be understood that both the motherboard 46 of the main backplane 40 and the circuit board 58 of the backplane strip 42 are capable of having multiple conductors 92, 94 for enhanced current carrying capacity. The cut-through vias 96 electrically connect particular connecting members 44 to the particular conductors 92, 94. Furthermore, it should be understood that both the motherboard 46 and the circuit board 58 are capable of carrying a variety of signals (e.g., multiple power supply signals, ground signals, power supply control signals, data signals, etc.). Such signals are capable of being conveyed through the connecting members 44 as well as through additional connections (e.g., through connectors, pins or contact buttons extending between the circuit board 58 of the backplane strip 42 and the motherboard 46).

It should be further understood that the motherboard 46 of the main backplane 40 and the circuit board 58 of the backplane strip 42 are both configured as printed circuit boards. Accordingly, both boards 46, 58 are capable of being provisioned with signal conditioning features for robust signal integrity. For example, both boards 46, 58 are capable of being fabricated from similar materials with similar dimensions for harmonizing signaling characteristics (e.g., matching impedances, wave propagation delays, etc.) thus enabling the backplane strip 42 to carry high speed signals (e.g., data signals) if desired or necessary. Furthermore, both the boards 46, 58 are capable of supporting electronic components such as terminating circuits, integrated circuit devices, discreet components, and the like (also see the motherboard components 52 and the backplane strip components 60 in FIG. 1) for reliable signal control and signal integrity. Such signal conditioning features are superior to conventional approaches which involve simply connecting cables or bare metallic busbars across the backs of backplanes and which do not lend themselves well to providing circuit board characteristics such as impedance matching and ability to attach electronic components. Further details of the invention will now be provided with reference to FIG. 3.

Figure 3:
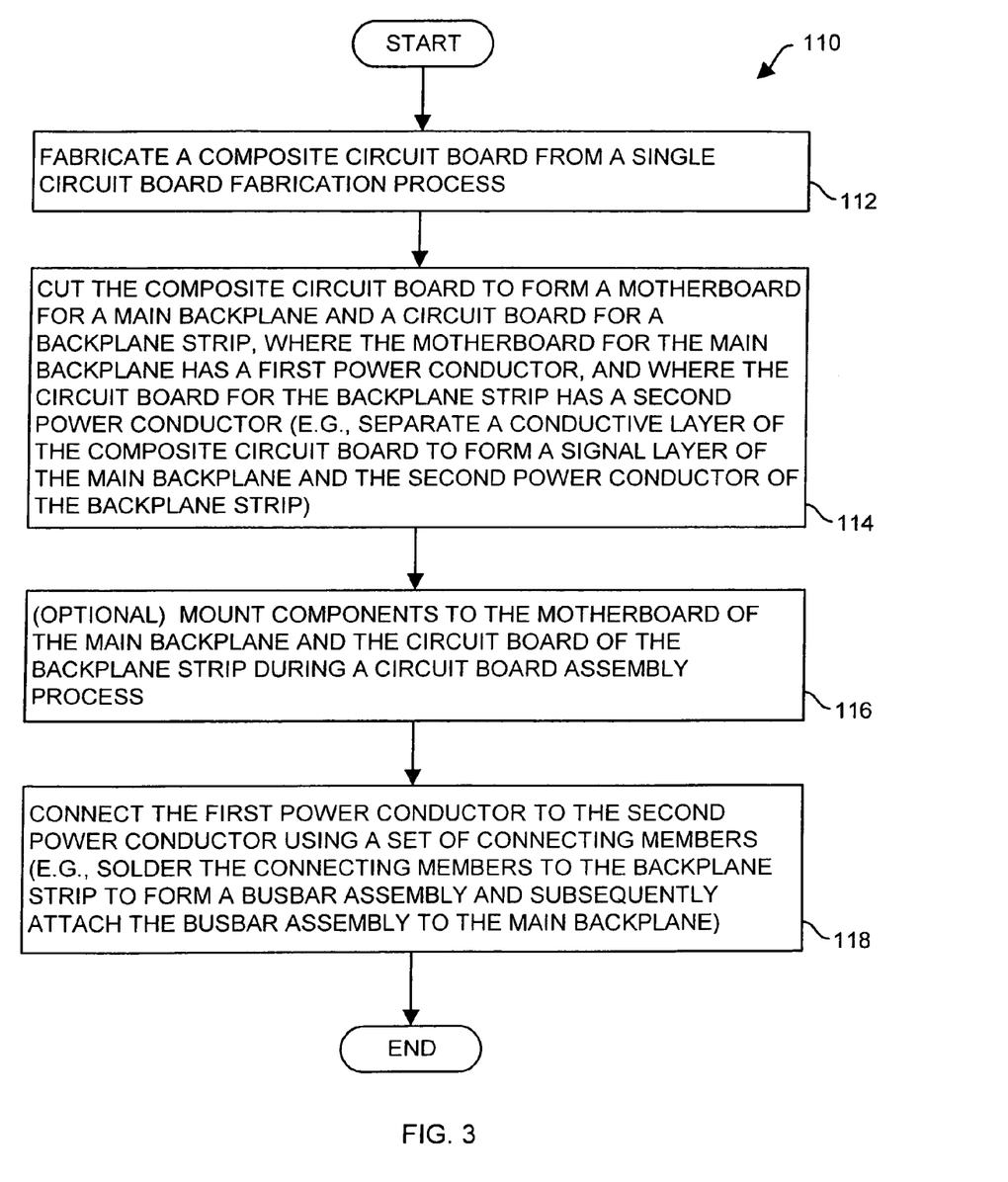
FIG. 3 is a flowchart of a procedure for manufacturing the backplane assembly of FIG. 2.

FIG. 3 is a flowchart of a procedure 110 which is performed by a manufacturer when manufacturing the backplane assembly 30 using a single circuit board fabrication process to minimize costs. In step 112, the manufacturer fabricates a composite circuit board panel having both a motherboard portion and a backplane strip portion. In particular, it is common practice for manufacturers to make their backplane boards with excess portions for testing and quality control purposes, e.g., with test coupons to verify that there are no shorts and that the backplane boards have proper surface insulation resistance (SIR). The manufacturer eventually cuts away and disposes of these excess portions. During step 112, the manufacture a composite panel with such excess portions but with at least one additional excess portion which will eventually become the circuit board 58 of the backplane strip 42 (FIGS. 1 and 2) thus alleviating the need for the manufacture to have a separate fabrication process for making the backplane strip 42. Rather, the manufacturer makes the bare circuit board for both the motherboard 46 and the circuit board 58 during a single fabrication process thus minimizing fabrication costs.

In step 114, the manufacturer cuts the composite panel to form the motherboard 46 of the main backplane 40 and the circuit board 58 of the backplane strip 42. Both the mother board 46 and the circuit board 58 have power conductors for carrying power supply signals (e.g., see the power conductor 92 of the motherboard 46 and the power conductor 94 of the circuit board 58 in FIG. 2). It should be understood that the same conductive layer of the composite panel, after cutting, can be used to carry different signals. For example, after cutting, a particular conductor layer can be used for carrying data signals in the motherboard 46 and a power signal in the circuit board 58.

In step 116, which is optional, the manufacturer mounts electronic components to the motherboard 46 and the circuit board 58. In one arrangement, the electronic components (e.g., signal conditioning and termination circuits) are soldered to the motherboard 46 and the circuit board 58 during separate circuit board assembly processes. These components are preferably configured to perform signal conditioning operations during operation of the system 20.

In step 118, the manufacturer connects a power conductor of the motherboard 46 to the circuit board 58 of the backplane strip 42. In particular, the manufacturer electrically connects the conductor 92 of the motherboard 46 to the conductor 94 of the circuit board 58 through the connecting members 44 (FIG. 2). In one arrangement, the connecting members 44 are soldered to the circuit board 58 concurrently as the electronic components are soldered to the circuit board 58 in step 116 thus requiring only one circuit board assembly process for making the backplane strip 42. For this arrangement, the circuit board 58 in combination with the connecting members 44 forms an enhanced busbar assembly which is superior to a bare metal busbar or a cable because the circuit board 58 is capable of being impedance matched with the motherboard 46 as well as supporting the electronic components for signal conditioning and control purposes. The manufacturer then attaches the busbar assembly to the main backplane 40 (e.g., using reflow soldering, using hardware, etc.). The resulting backplane assembly 30 (also see FIG. 1) thus has a main backplane 40 with less layers and multiple extra current carrying paths in a small form factor to improve current distribution through the backplane assembly 30. All of this is capable of being accomplished at a relatively low cost (e.g., by making the backplane strip circuit board 58 together with the motherboard 46 in a composite panel during the single fabrication process).

During operation, current passes through both conductors 92, 94 thus improving current distribution through the backplane assembly 30 to support operation of high power circuitry on the modules 32. The use of the backplane strip 42 for increasing current distribution through the backplane assembly 30 results in significantly lower costs than those associated with either adding backplane layers or thickening backplane layers. Further details of the invention will now be provided with reference to FIG. 4 and the following example.

Suppose that a manufacturer is tasked with designing a particular configuration for the system 20 (also see FIG. 1) which involves interconnecting and powering the set of circuit board modules 30 through the backplane assembly 30. Due to physical requirements, the motherboard 46 is to be 12 inches wide by 16 inches deep, i.e., 12 inches in the X-direction and 16 inches in the Y-direction as shown in FIGS. 1 and 2. Further suppose that the backplane assembly 30 is to carry three power signals 200, i.e., three different voltages. Further suppose that the manufacturer has decided to use 1 oz copper for the thicknesses of each conductive layer (see the conductors 92, 94 in FIG. 2) and has already determined and calculated the total power consumption requirements of the system 20 in terms of the width of the conductive layers (i.e., the dimension of the conductive layers in the X-direction of FIG. 2) needed for each power signal 200 as follows:

Power signal 200(1): 9 inch wide copper from front to back using 1 oz copper

Power signal 200(2): 12 inch wide copper from front to back using 1 oz copper

Power signal 200(3): 7 inch wide copper from front to back using 1 oz copper

Further suppose that the manufacturer must meet additional requirements to support conveyance of high speed signals through the motherboard 46 (e.g., the manufacturer must provide an adequate number of signal layers and ground planes for proper conveyance of data signals between the modules 30, and so on).

Figure 4:
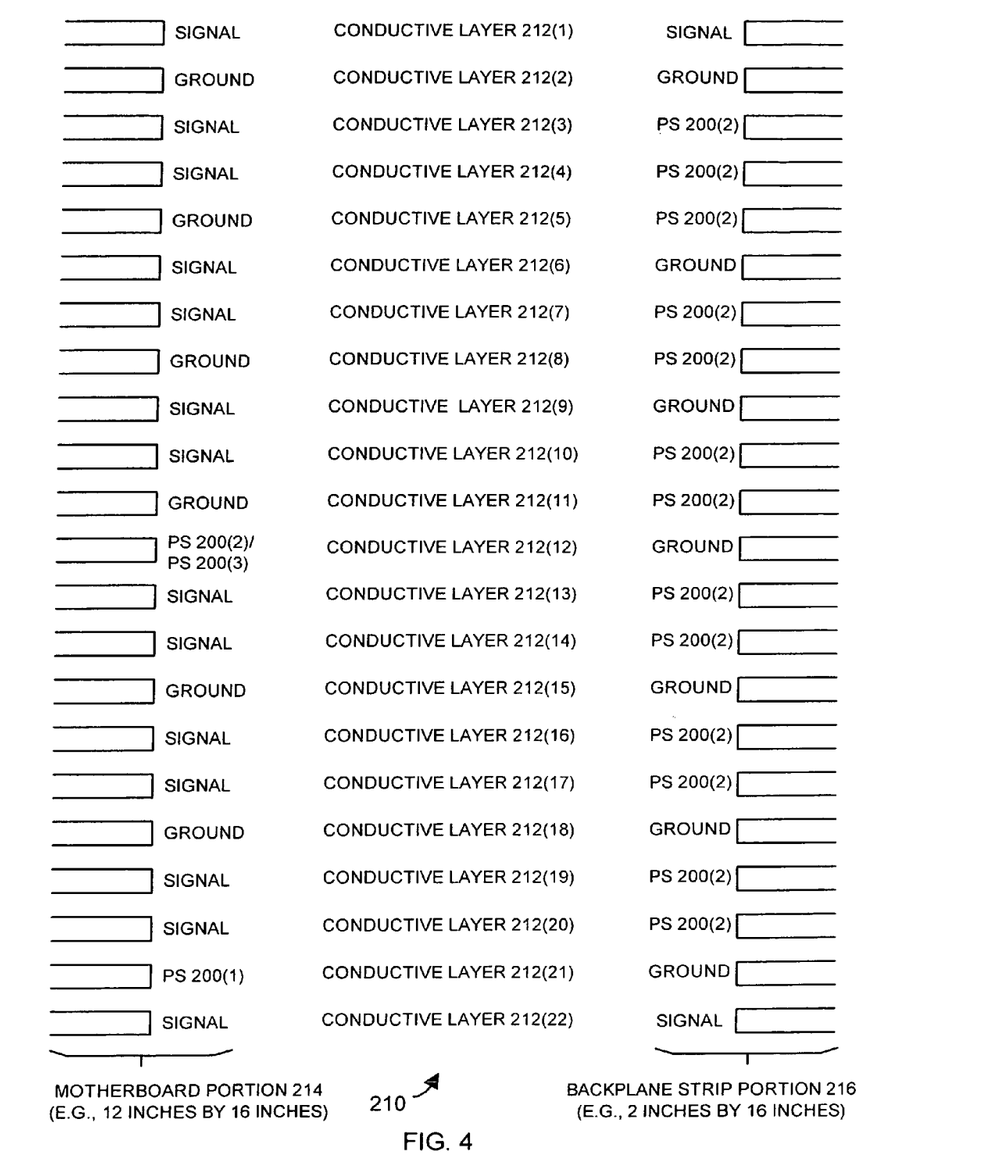
FIG. 4 is a diagram illustrating an exemplary configuration of conductive layers of the main backplane and the backplane strip of FIG. 2.

FIG. 4 shows a layout for a composite panel 210 which is capable of being fabricated by a single circuit board fabrication process (step 112 in FIG. 3), and then separated (step 114) and further processed (e.g., routed, plated, washed, assembly with electronic components, etc.) into (i) a motherboard portion 214 which eventually forms the motherboard 46 of the main backplane 40 and (ii) a backplane strip portion 216 which eventually forms the circuit board 58 of the backplane strip 42. The motherboard portion 214 has the earlier-set-forth dimensions (i.e., 12 inches wide by 16 inches long). The backplane strip portion 216 is generally the same length as the motherboard portion 214 but is only 2 inches wide. As further shown, the composite panel 210 includes twenty-two (22) conductive layers 212 of 1 oz copper which is separated by non-conductive material (e.g., FR4). One of skill in the art will appreciate that the composite panel 210 is capable of being made by a conventional fabrication process, e.g., making individual sheets having a central non-conductive layer with copper on both sides, and gluing the sheets together to form the composite panel 210) and then forming cut-through vias to interconnect the conductive layers together. It should be understood that, if the manufacturer is resigned to make the motherboard portion 214, hardly any additional sacrifice is made by the manufacturer to further make the backplane strip portion 216 since it is common for PCB manufacturers to provide excess portions for testing and quality verification of the fabrication process (e.g., excess portions for test coupons to confirm SIR is within specified tolerances). The resulting backplane assembly 30 (step 118) will utilize enough connecting members 44 (or perhaps other connecting such as connectors, pins or contact buttons) to convey all of the signals shown in FIG. 4 between the motherboard 46 and the backplane strip circuit board 58.

As shown in FIG. 4, the conductive layer 212(21) within the motherboard portion 214 of the composite panel 210 is made as a contiguous power plane and configured to carry the power signal 200(1). Additionally, the conductive layer 212(12) within the motherboard portion 214 of the composite panel 210 is split into two power planes for respectively carrying the power signals 200(2) and 200(3). As will now be explained, the use of the backplane strip portion 216 of the composite panel 210 enables manufacture of the backplane assembly 30 (FIG. 1) in a manner that robustly satisfies the above-described power consumption requirements.

In particular, recall that the manufacturer must provide a 9 inch width of 1 oz copper from front to back for the power signal 200(1). To satisfy this requirement, the manufacturer provides the conductive layer 212(21), as a contiguous power plane, in the motherboard portion 214 of the composite panel 210. Although there will be some holes through the motherboard 46 (e.g., to accommodate cut-through vias and connectors), there is still at least 9 inches of copper left for the power signal 200(1) since the motherboard portion 214 is about 12 inches wide. Accordingly, the manufacturer satisfies the requirement for the power signal 200(1).

Further recall that the manufacturer must provide a 7 inch width of 1 oz copper from front to back for the power signal 200(3). To satisfy this requirement, the manufacturer allocates a 9.7 inch wide section of the conductive layer 212(12) within the motherboard portion 214 of the composite panel 210 for a power plane to carry the power signal 200(3). After one takes the holes into account, there is at least 7 inches of copper left for the power signal 200(3). Accordingly, the manufacturer satisfies the requirement for the power signal 200(3).

What remains within the motherboard portion 214 of the composite panel 210 is a 2 inch wide section of the conductive layer 212(12) for carrying the power signal 200(3). Accordingly, another 10 inches width of copper is required for carrying the power signal 200(2), and this is where the backplane strip portion 216 of the composite panel 210 works to satisfy this requirement. In particular, as shown in FIG. 4, the backplane strip portion 216 includes 13 layers which are dedicated to carrying the power signal 200(2). After one takes the holes through the backplane strip portion 216 into account, there is 0.9 inches width of copper left in each of the 13 layers for the power signal 200(2). As a result, there is 11.7 inches of copper for the power signal 200(2) in the backplane strip portion 216 and 2 inches width of copper for the power signal 200(2) in the motherboard portion 214 giving a total of 13.7 inches width which exceeds the requirement of 12 inches width of copper for the power signal 200(2). Hence, the composite panel 210 ability to provide the backplane strip portion 216 for use as the circuit board 58 of the backplane strip 42 in the backplane assembly 30 (FIGS. 1 and 2) enables the manufacturer to satisfy the power requirements for all three power signals 200. Moreover, use of the composite panel 210 alleviated the need for the manufacturer provide (i) additional conductive layers and/or (ii) thicker conductive layers as in conventional approaches to increasing current distribution within a backplane thus keeping costs and complexity down.

As described above, embodiments of the invention are directed to techniques for distributing current using a main backplane 40 and a backplane strip 42 which is configured to carry current in parallel with a power conductor 92 of the main backplane 40. The backplane strip 42 includes circuit board material which is capable of being made from an excess portion 216 of a composite panel 210 during the backplane fabrication process. Accordingly, the backplane strip 42 is capable of being configured to have the same characteristics as the main backplane 40 itself for robust signal integrity (e.g., impedance matching) and safety (no exposed busbars). Furthermore, costs associated with utilizing the backplane strip 42 can be significantly lower than those associated with either adding backplane layers or thickening backplane layers, as in conventional approaches to increasing current distribution in a backplane design.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the electronic system 20 was described above as being a data communications system by way of example only. In other arrangements, the electronic system 20 is configured to perform other operations (e.g., a general purpose computer system, a database system, a specialized real-time electronic system, etc.).

Additionally, it should be understood that the backplane assembly 30 of the electronic system 20 was described above as connecting a total of eight modules 30 together by way of example only. The backplane assembly 30 is well suited for connecting other numbers of modules together (e.g., 6, 12, 16, 24, etc.) and eight was chosen for exemplary purposes only.

Furthermore, it should be understood that the composite panel 210 was described above as providing one motherboard portion 214 and one backplane strip portion 216 by way of example only. It should be understood that each composite panel 210 is capable of being configured to provide other numbers motherboard portions 214 and backplane strip portions 216 (e.g., two motherboard portions 214 and two backplane strip portions 216, one motherboard portion 214 and four backplane strip portions 216, etc.).

Figure 5:
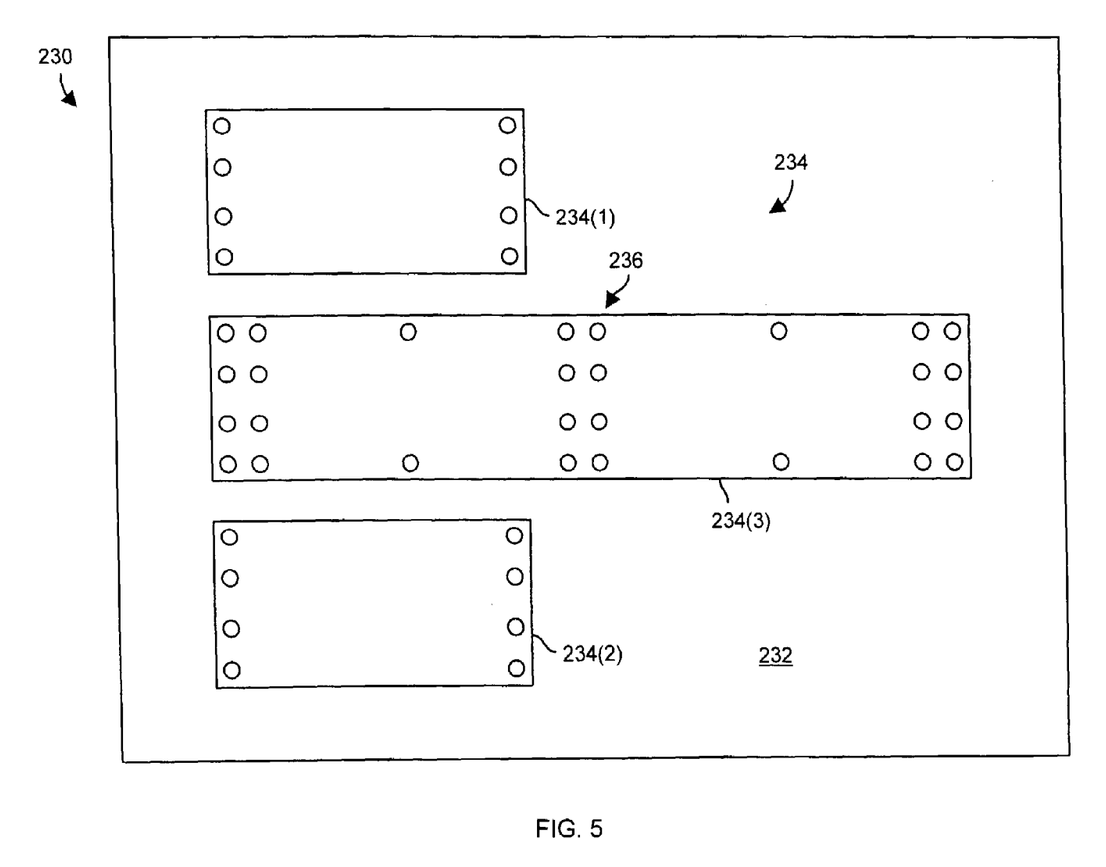
FIG. 5 is a view of a backplane assembly having a main backplane and multiple backplane strips.

Additionally, it should be understood that the backplane assembly 30 is capable of including more than one backplane strip 42. FIG. 5 shows a rear view of a backplane assembly 230 which is suitable for use in the electronic system 20. The backplane assembly 230 includes a main backplane 232, multiple backplane strips 234(1), 234(2), 234(3) (collectively, backplane strips 234) and connecting members 236. The backplane strips 234(1), 234(2) are similar to the backplane strip 42 in that the backplane strips 234(1), 234(2) carry only one power signal (and perhaps a ground reference signal). However, for illustration purposes only, the backplane strip 234(3) is configured to carry multiple power signals (i.e., different voltages) and to distribute the power signals over a large region of the main backplane 232. Accordingly, there are several sets of connecting members which hold the backplane strip 234(3) and which provide robust electrical connectivity between the backplane strip 234(3) and the main backplane 232.

Furthermore it should be understood that the shape of the backplane strips 42, 234 were shown and described above as being rectangular by way of example only. It should be understood that the backplane strips 42, 234 can be any shape and have any number of conductive layers. Moreover, the circuit boards of the backplane strips 42, 234 can be fabricated along with the motherboards 46 by making the boards within the same composite panels to save costs. Alternatively, the circuit boards of the backplane strips 42, 234 can be fabricated separately from the motherboards 46. Such modifications and enhancements are intended to belong to various embodiments of the invention.

What is claimed is:

1. A data communications device, comprising:
 a chassis having a front and a back;
 a backplane assembly disposed at the back of the chassis, the backplane assembly including:
   a main backplane having a first power conductor;
   a backplane strip having a second power conductor; and
   a set of connecting members disposed between the main backplane and the backplane strip to (i) hold the backplane strip in a fixed position relative to the main backplane and (ii) electrically connect the first power conductor and the second power conductor; and
 modules which are configured to insert through the front of the chassis and connect to the backplane assembly, the modules being further configured to perform data communications operations on data elements entering and exiting the data communications device in response to power provided through the first and second power conductors;

wherein the set of connecting members of the backplane assembly includes:
source standoffs which extend from a source area of the main backplane to the backplane strip; and
target standoffs which extend from a target area of the main backplane to the backplane strip, the source and target standoffs and the second power conductor providing a current path which increases current carrying capacity from the source area to the target area above that provided by the first power conductor alone.

2. The data communications device of claim 1 wherein the main backplane of the backplane assembly includes:
a motherboard having a front side, a back side and the first power conductor; and
rows of connectors disposed on the front side of the motherboard, wherein the rows of connectors are configured to connect with the modules, and wherein the set of connecting members extends from the back side of motherboard toward the backplane strip to support the backplane in a substantially parallel manner relative to the motherboard.

3. The data communications device of claim 1 wherein the backplane assembly further includes:
additional backplane strips and additional connecting members which connect the additional backplane strips to the main backplane.

4. A backplane assembly, comprising:
a main backplane having a first power conductor;
a backplane strip having a second power conductor; and
a set of connecting members disposed between the main backplane and the backplane strip to (i) hold the backplane strip in a fixed position relative to the main backplane and (ii) electrically connect the first power conductor and the second power conductor;
wherein the set of connecting members includes:
source standoffs which extend from a source area of the main backplane to the backplane strip, and
target standoffs which extend from a target area of the main backplane to the backplane strip, the source and target standoffs and the second power conductor providing a current path which increases current carrying capacity from the source area to the target area above that provided by the first power conductor alone.

5. The backplane assembly of claim 4 wherein the main backplane includes a first circuit board having multiple layers of conductive and non-conductive material combined together, wherein the backplane strip includes a second circuit board having multiple layers of conductive and non-conductive material combined together, and wherein the first and second circuit boards have substantially matching impedance characteristics.

6. The backplane assembly of claim 4 wherein the main backplane and the backplane strip originate from a single circuit board fabrication process that generates a composite circuit board from which the main backplane and at least one backplane strip is cut.

7. The backplane assembly of claim 4 wherein the main backplane includes:
a motherboard having a front side, a back side and the first power conductor; and
rows of connectors disposed on the front side of the motherboard, wherein the rows of connectors are configured to connect with respective modules disposed in a substantially parallel manner to each other, and wherein the set of connecting members extends from the back side of motherboard toward the backplane strip to support the backplane in a substantially parallel manner relative to the motherboard.

8. The backplane assembly of claim 4, further comprising:
additional backplane strips and additional connecting members which connect the additional backplane strips to the main backplane.

9. The backplane assembly of claim 5 wherein the backplane strip further includes:
a set of electronic components mounted to the second circuit board to perform signal sensing and conditioning of a power supply signal passing through the second power conductor.

10. The backplane assembly of claim 6 wherein the composite circuit board includes a conductive layer which forms (i) a signal layer of the main backplane and (ii) the second power conductor of the backplane strip, wherein the signal layer of the main backplane is different than the first power conductor of the main backplane, wherein the signal layer of the main backplane is configured to carry data signals, and wherein the second power conductor of the backplane strip is configured to carry a power signal.

11. The backplane assembly of claim 10 wherein the backplane strip includes:
a circuit board having multiple power conductors which are substantially parallel to each other, and cut-through vias which electrically connect the multiple power conductors together.

12. The backplane assembly of claim 9 wherein the backplane strip further includes:
electrical contacts which extend from the second circuit board to the first circuit board in a direction that is substantially parallel to the source and target standoffs, the electrical contacts being configured to carry control signals to control operation of the set of electronic components mounted to the second circuit board.

13. The backplane assembly of claim 11 wherein the multiple power conductors of the circuit board are configured to carry (i) a first power signal having a first potential difference relative to a ground reference, and (ii) a second power signal having a second potential different relative to the ground reference that is different than the first potential difference, and wherein the circuit board further includes a ground conductor configured to carry the ground reference.

14. A backplane assembly, comprising:
a main backplane having a first power conductor;
a backplane strip having a second power conductor; and
a set of connecting members disposed between the main backplane and the backplane strip to (i) hold the backplane strip in a fixed position relative to the main backplane and (ii) electrically connect the first power conductor and the second power conductor;
wherein the main backplane includes:
a motherboard having a front side, a back side and the first power conductor; and
rows of connectors disposed on the front side of the motherboard, wherein the rows of connectors are configured to connect with respective modules disposed in a substantially parallel manner to each other, and wherein the set of connecting members extends from the back side of motherboard toward the backplane strip to support the backplane in a substantially parallel manner relative to the motherboard;

wherein the backplane strip includes:
a circuit board having multiple power conductors which are substantially parallel to each other, and cut-through vias which electrically connect the multiple power conductors together; and wherein the set of connecting members include:
standoffs which are soldered to the cut-through vias of the circuit board to electrically connect the multiple power conductors of the circuit board to the first power conductor of the main backplane.

15. A backplane assembly, comprising:
a main backplane having a first power conductor;
a backplane strip having a second power conductor; and
connecting means for holding the backplane strip in a fixed position relative to the main backplane and electrically connecting the first power conductor and the second power conductor;

wherein the connecting means includes;
source standoffs which extend from a source area of the main backplane to the backplane strip; and
target standoffs which extend from a target area of the main backplane to the backplane strip, the source and target standoffs and the second power conductor providing a current path which increases current carrying capacity from the source area to the target area above that provided by the first power conductor alone.

* * * * *

UNITED STATES PATENT AND TRADEMARK OFFICE
CERTIFICATE OF CORRECTION

PATENT NO. : 7,154,761 B1 Page 1 of 1
APPLICATION NO. : 10/778418
DATED : December 26, 2006
INVENTOR(S) : Sergio Camerlo and Irfan Elahi It is certified that error appears in the above-identified patent and that said Letters Patent is hereby corrected as shown below:

Column 12, line 28, for the claim reference numeral "10", should read --7--.

Signed and Sealed this

Sixth Day of March, 2007

JON W. DUDAS
*Director of the United States Patent and Trademark Office*